(12) United States Patent
Yoshida et al.

(10) Patent No.: US 10,943,932 B2
(45) Date of Patent: *Mar. 9, 2021

(54) LIGHT-RECEIVING ELEMENT, METHOD OF MANUFACTURING LIGHT-RECEIVING ELEMENT, IMAGING DEVICE, AND ELECTRONIC APPARATUS

(71) Applicant: SONY SEMICONDUCTOR SOLUTIONS CORPORATION, Kanagawa (JP)

(72) Inventors: Shinichi Yoshida, Kanagawa (JP); Shunsuke Maruyama, Kanagawa (JP); Ryosuke Matsumoto, Tokyo (JP); Shuji Manda, Kanagawa (JP); Tomomasa Watanabe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/655,647

(22) Filed: Oct. 17, 2019

(65) Prior Publication Data
US 2020/0052011 A1 Feb. 13, 2020

Related U.S. Application Data

(63) Continuation of application No. 15/778,940, filed as application No. PCT/JP2016/077091 on Sep. 14, 2016, now Pat. No. 10,483,299.

(30) Foreign Application Priority Data

Dec. 11, 2015 (JP) .............................. JP2015-242235

(51) Int. Cl.
*H01L 31/0224* (2006.01)
*H01L 27/144* (2006.01)
(Continued)

(52) U.S. Cl.
CPC ........ *H01L 27/1443* (2013.01); *H01L 27/144* (2013.01); *H01L 27/146* (2013.01);
(Continued)

(58) Field of Classification Search
CPC ..................... H01L 27/146; H01L 31/022408
See application file for complete search history.

(56) References Cited

U.S. PATENT DOCUMENTS

| 5,144,396 | A | 9/1992 | Sargood | |
|---|---|---|---|---|
| 10,483,299 | B2 * | 11/2019 | Yoshida | ............ H01L 27/14649 |
| 2002/0185641 | A1 | 12/2002 | Mohri | |

FOREIGN PATENT DOCUMENTS

| CA | 1314110 C | 3/1993 |
|---|---|---|
| DE | 3879730 T2 | 8/1993 |

(Continued)

OTHER PUBLICATIONS

Non-Final Office Action for U.S. Appl. No. 15/778,940, dated Apr. 9, 2019, 19 pages.
(Continued)

*Primary Examiner* — Thomas L Dickey
(74) *Attorney, Agent, or Firm* — Chip Law Group

(57) ABSTRACT

This light-receiving element includes: a substrate; a photoelectric conversion layer that is provided on the substrate and includes a first compound semiconductor, and absorbs a wavelength in an infrared region to generate electric charges; a semiconductor layer that is provided on the photoelectric conversion layer and includes a second compound semiconductor, and has an opening in a selective region; and an electrode that buries the opening of the semiconductor layer and is electrically coupled to the photoelectric conversion layer.

16 Claims, 9 Drawing Sheets

(51) Int. Cl.
  *H01L 27/146* (2006.01)
  *H01L 31/103* (2006.01)
  *H01L 31/0216* (2014.01)
  *H04N 5/33* (2006.01)
  *H04N 5/369* (2011.01)
  *H01L 31/102* (2006.01)

(52) U.S. Cl.
  CPC .. *H01L 27/14603* (2013.01); *H01L 27/14649* (2013.01); *H01L 31/0224* (2013.01); *H01L 31/02161* (2013.01); *H01L 31/022408* (2013.01); *H01L 31/102* (2013.01); *H01L 31/1035* (2013.01); *H04N 5/33* (2013.01); *H04N 5/369* (2013.01)

(56) References Cited

FOREIGN PATENT DOCUMENTS

| | | | |
|---|---|---|---|
| EP | 0279651 | A1 | 8/1988 |
| EP | 0404987 | A1 | 1/1991 |
| GB | 8703592 | A | 3/1987 |
| JP | 61-49484 | A | 3/1986 |
| JP | 63-228767 | | 9/1988 |
| JP | 01-503664 | A | 12/1989 |
| JP | 2002-343951 | A | 11/2002 |
| JP | 2007-184410 | | 7/2007 |
| JP | 2015-056617 | A | 3/2015 |
| WO | 88/006350 | A1 | 8/1988 |
| WO | 2017/098769 | A1 | 6/2017 |

OTHER PUBLICATIONS

Notice of Allowance for U.S. Appl. No. 15/778,940, dated Jul. 17, 2019, 05 pages.

International Search Report and Written Opinion of PCT Application No. PCT/JP2016/077091, dated Dec. 6, 2016, 09 pages of English Translation and 07 pages of ISRWO.

International Preliminary Report on Patentability of PCT Application No. PCT/JP2016/077091, dated Jun. 21, 2018, 09 pages of English Translation and 04 pages of IPRP.

* cited by examiner

[FIG. 2]
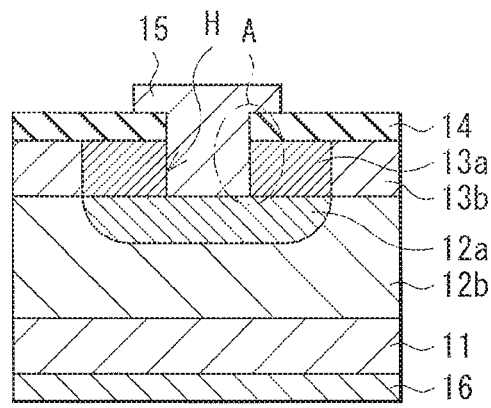
[FIG. 3A]
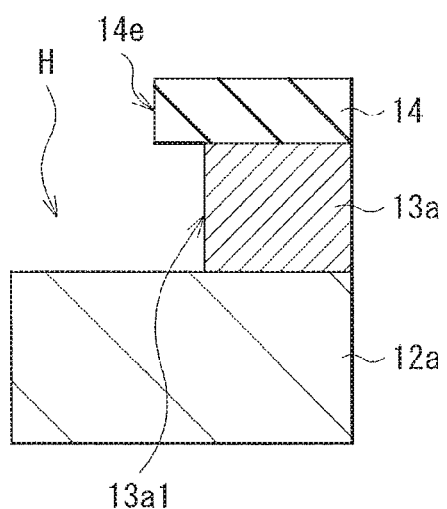
[FIG. 3B]
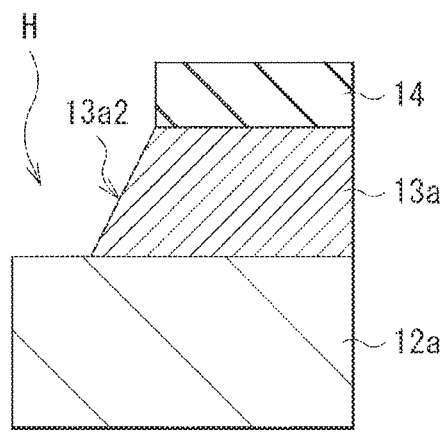

[FIG. 4]
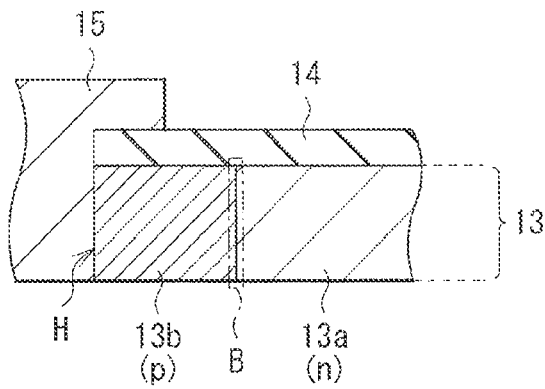
[FIG. 5]
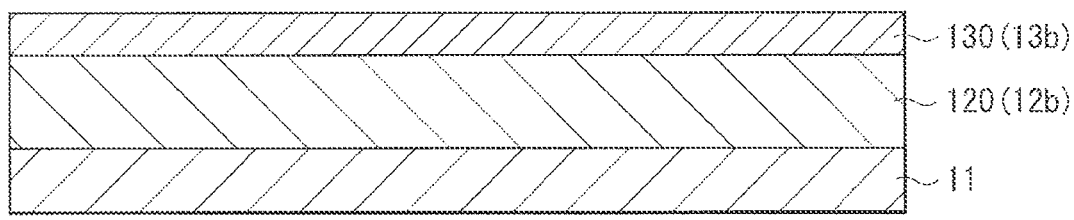
[FIG. 6A]
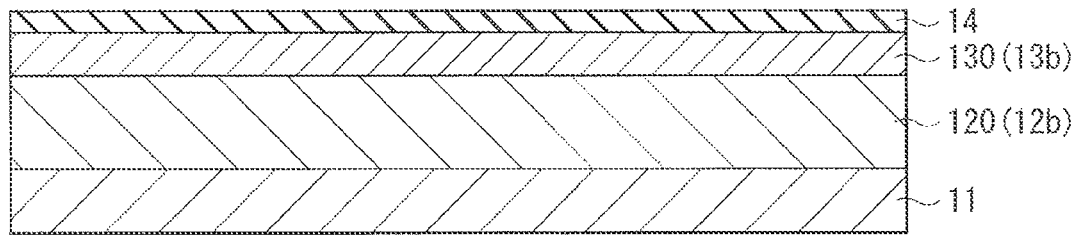
[FIG. 6B]
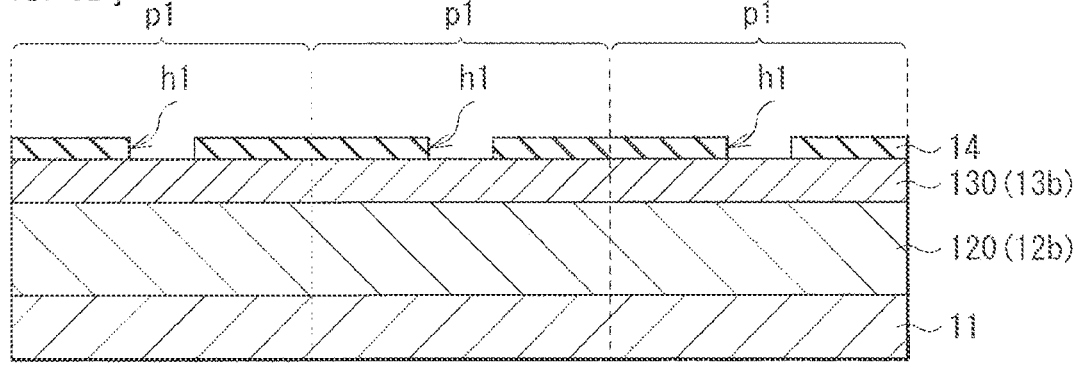

[FIG. 7]
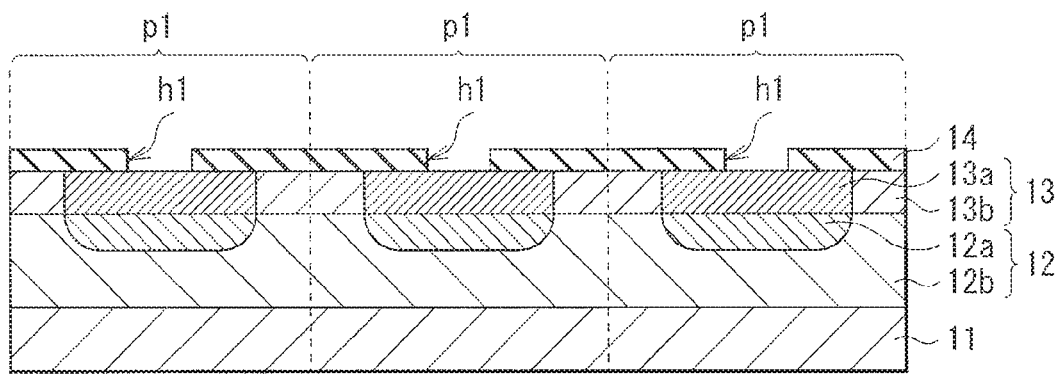
[FIG. 8]
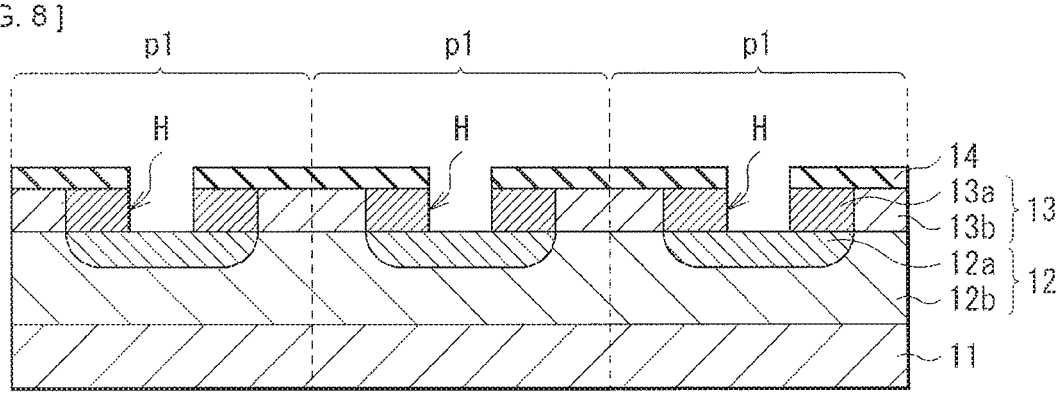
[FIG. 9]
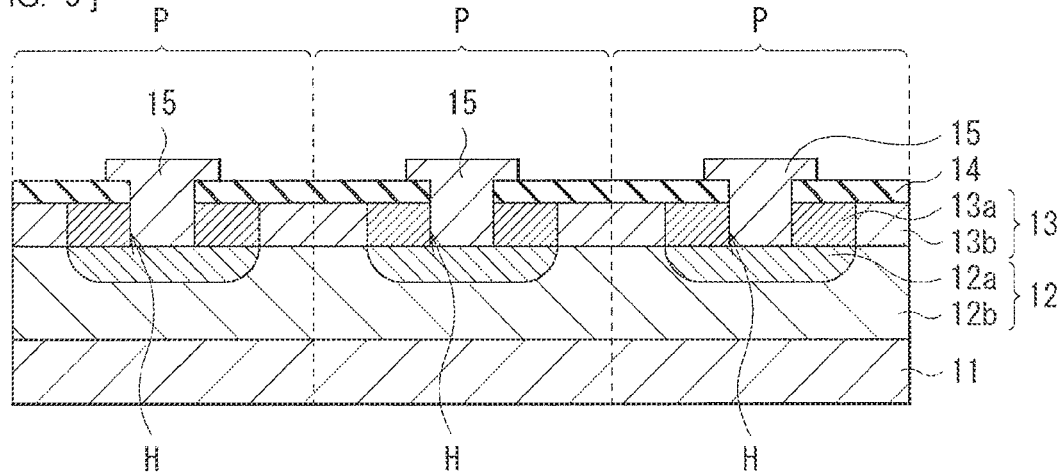

[FIG. 10A]
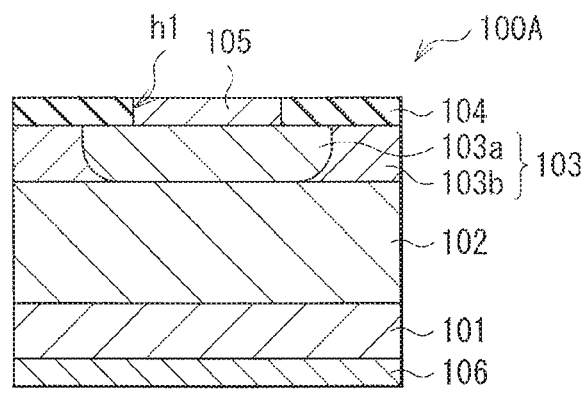
[FIG. 10B]
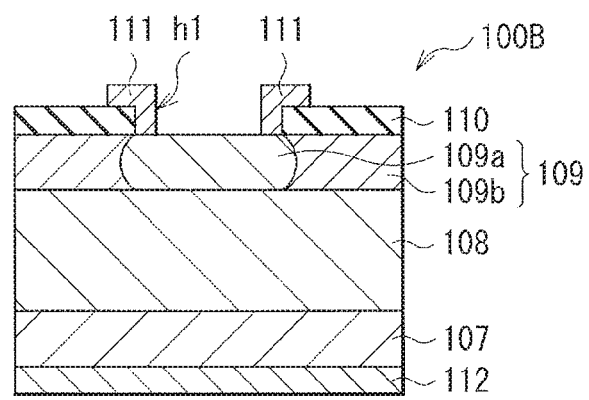
[FIG. 11]
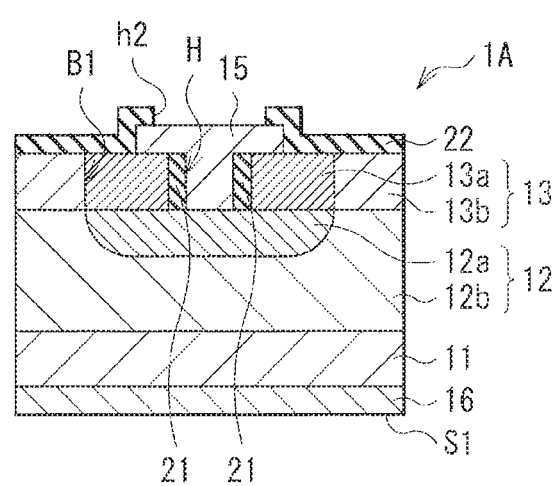

[FIG. 12]
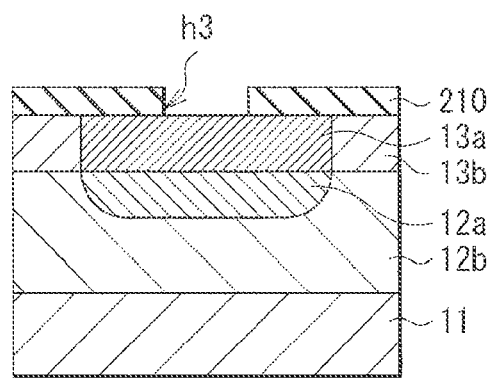
[FIG. 13]
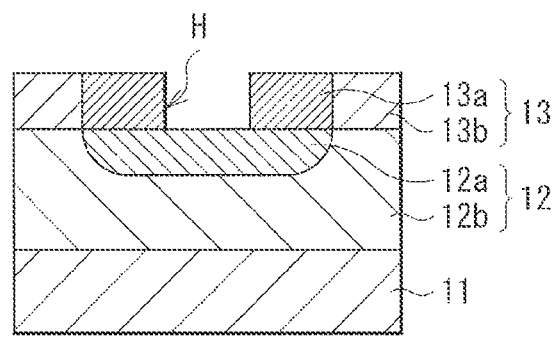
[FIG. 14A]
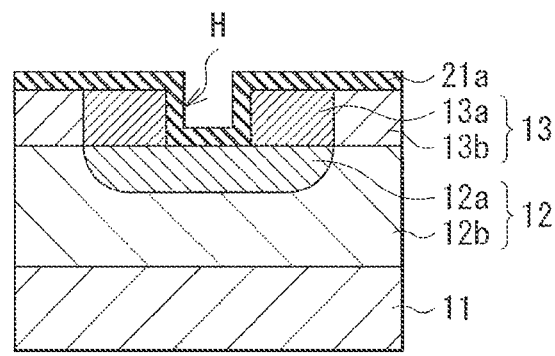
[FIG. 14B]
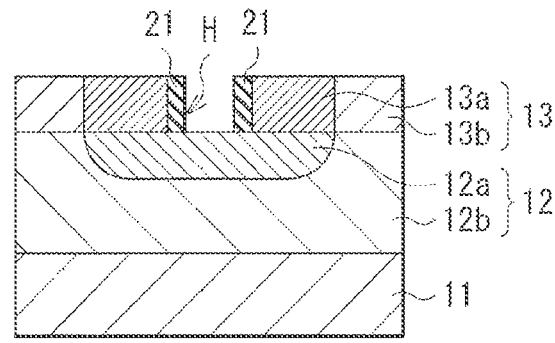

[FIG. 15]
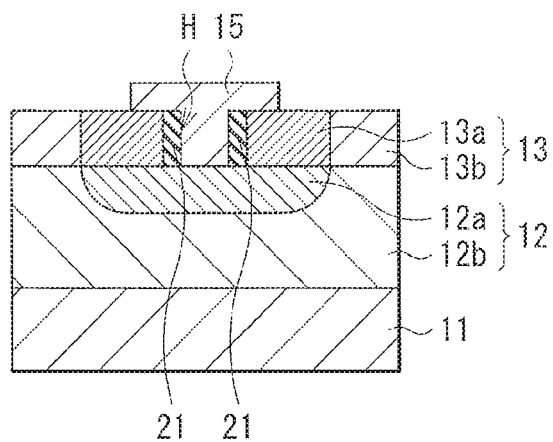
[FIG. 16A]
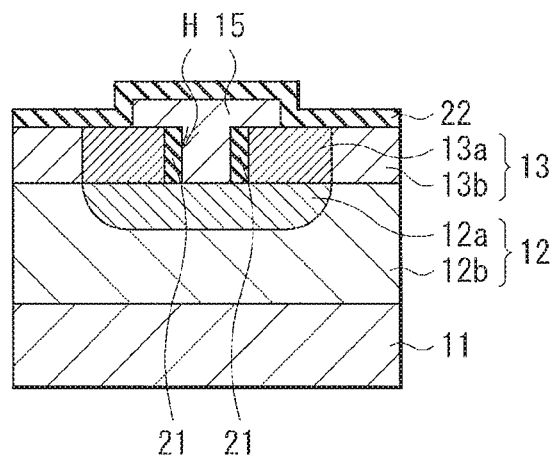
[FIG. 16B]
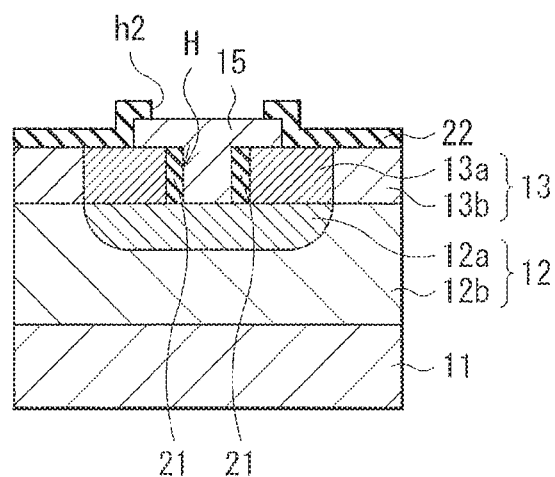

[FIG. 17]
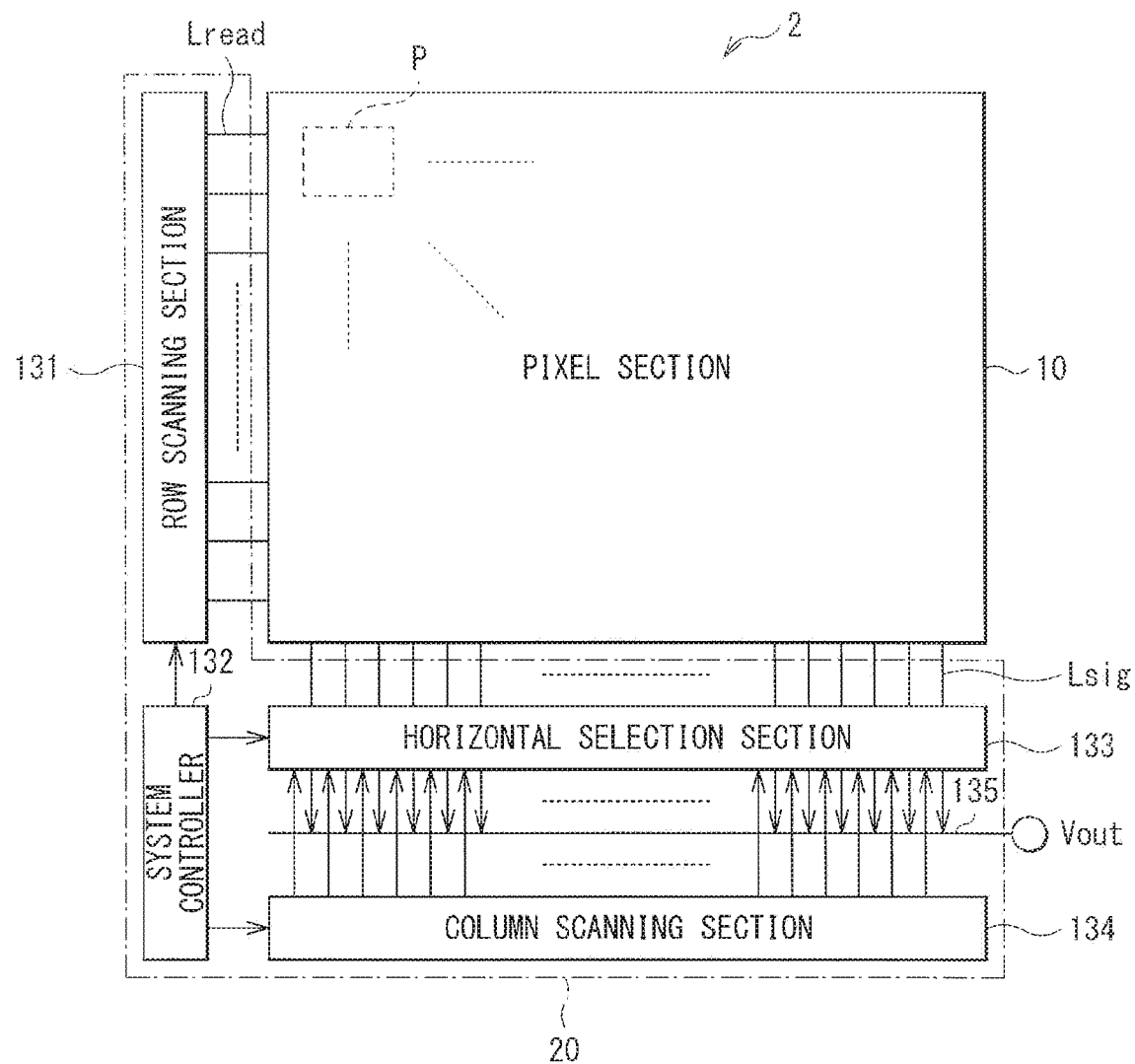
[FIG. 18]
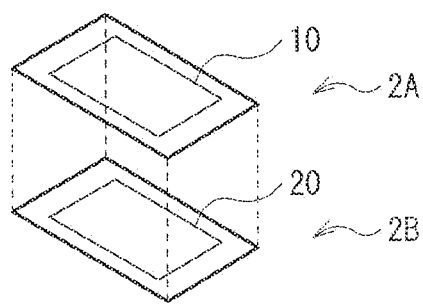

[FIG. 19]
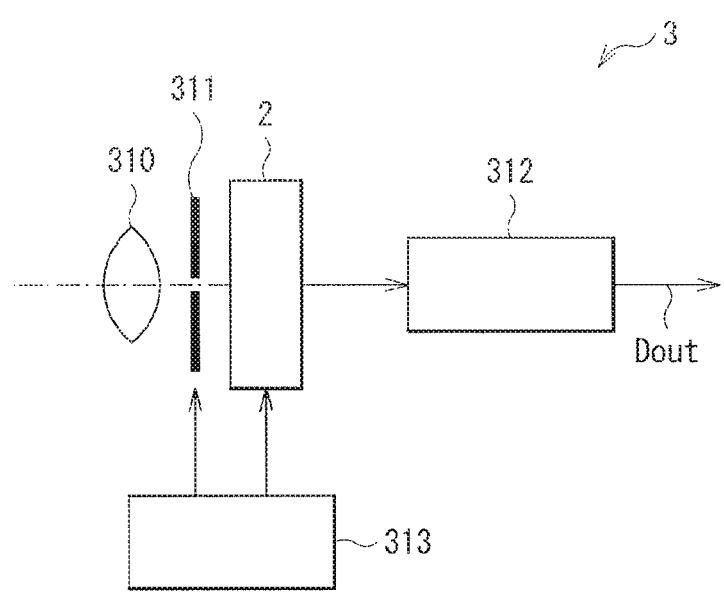

LIGHT-RECEIVING ELEMENT, METHOD OF MANUFACTURING LIGHT-RECEIVING ELEMENT, IMAGING DEVICE, AND ELECTRONIC APPARATUS

CROSS REFERENCE TO RELATED APPLICATIONS

The present application is a continuation application of U.S. patent application Ser. No. 15/778,940, filed on May 24, 2018, which is National Stage Entry of Patent Application No. PCT/JP2016/077091 filed on Sep. 14, 2016, which claims priority from Japanese Patent Application No. JP 2015-242235 filed in the Japan Patent Office on Dec. 11, 2015, the entire contents of which are hereby incorporated by reference.

TECHNICAL FIELD

The disclosure relates to a light-receiving element used for an infrared sensor, for example, and to a method of manufacturing the light-receiving element, to an imaging device, and to an electronic apparatus.

BACKGROUND ART

In recent years, an image sensor (an infrared sensor) having sensitivity to an infrared region has been commercialized. In a light-receiving element used for this infrared sensor, a photoelectric conversion layer including a group III-V semiconductor such as InGaAs (indium gallium arsenide), for example, is provided, and electric charges are generated through the absorption of infrared light in this photoelectric conversion layer (photoelectric conversion is performed). Various proposals have been made for a device structure of such a light-receiving element or an imaging device (for example, PTL 1).

CITATION LIST

Patent Literature

PTL 1: Japanese Unexamined Patent Application Publication No. 2003-332551

SUMMARY OF INVENTION

In a light-receiving element described in an above-listed PTL1, a semiconductor layer having an impurity diffusion region is provided on a photoelectric conversion layer including a group III-V semiconductor. However, there may be a case in which such a device structure may not be able to ensure ohmic contact between an electrode and the semiconductor layer for the extraction of electric charges. As a result, so called voltage drop occurs, which prevents from acquiring the characteristics of a photodiode in accordance with applied voltage (current-voltage characteristics).

It is desirable to provide a light-receiving element, a method of manufacturing the light-receiving element, an imaging device, and an electronic apparatus that make it possible to maintain favorable photodiode characteristics.

A light-receiving element according to an embodiment of the disclosure includes: a substrate; a photoelectric conversion layer that is provided on the substrate and includes a first compound semiconductor, and absorbs a wavelength in an infrared region to generate electric charges; a semiconductor layer that is provided on the photoelectric conversion layer and includes a second compound semiconductor, and has an opening in a selective region; and an electrode that buries the opening of the semiconductor layer and is electrically coupled to the photoelectric conversion layer.

A method of manufacturing a light-receiving element according to an embodiment of the disclosure includes steps of: forming, on a substrate, a photoelectric conversion layer that includes a first compound semiconductor, and absorbs a wavelength in an infrared region to generate electric charges, and a semiconductor layer that includes a second compound semiconductor, and has an opening in a selective region; and forming, on the substrate, an electrode that buries the opening of the semiconductor layer and is electrically coupled to the photoelectric conversion layer.

In the light-receiving element and the method of manufacturing the light-receiving element according to the respective embodiments of the disclosure, the semiconductor layer including the second compound semiconductor is provided on the photoelectric conversion layer including the first compound semiconductor, and the opening is provided in a selective region of this semiconductor layer. Since the electrode is formed in a manner to bury the opening of this semiconductor layer and is electrically coupled to the photoelectric conversion layer, contact resistance is reduced as compared to the case in which the semiconductor layer is interposed between the electrode and the photoelectric conversion layer.

An imaging device according to an embodiment of the disclosure which is provided with a plurality of pixels includes: a substrate; a photoelectric conversion layer that is provided on the substrate and includes a first compound semiconductor, and absorbs a wavelength in an infrared region to generate electric charges; a semiconductor layer that is provided on the photoelectric conversion layer and includes a second compound semiconductor, and has an opening for each of the pixels; and a plurality of electrodes provided to bury the respective openings of the semiconductor layer and each electrically coupled to the photoelectric conversion layer.

An electronic apparatus according to an embodiment of the disclosure includes an imaging device according to an embodiment of the above-described disclosure.

According to the light-receiving element, the method of manufacturing the light-receiving element, the imaging device and the electronic apparatus according to the respective embodiments of the disclosure, the photoelectric conversion layer including the first compound semiconductor and the semiconductor layer including the second compound semiconductor are provided on the substrate, and the semiconductor layer has the opening in the selective region. Since the electrode buries this opening and is electrically coupled to the photoelectric conversion layer, it is possible to reduce contact resistance. Accordingly, it is possible to maintain favorable characteristics of a photodiode.

It is to be noted that the above descriptions are merely exemplified. The effects of the disclosure are not limited to the effects described above, and may be other different effects, or may further include other effects.

BRIEF DESCRIPTION OF DRAWINGS

FIG. 2 is a cross-sectional view describing a configuration of an opening of a semiconductor layer illustrated in FIG. 1.

FIG. 3A is an enlarged cross-sectional view of example of a configuration of a region A illustrated in FIG. 2.

FIG. 3B is an enlarged cross-sectional view of another example of a configuration of the region A illustrated in FIG. 2.

FIG. 4 is an enlarged cross-sectional view of a configuration of a semiconductor layer, a protective layer, and a first electrode illustrated in FIG. 1.

FIG. 5 is a cross-sectional view of a process of a method of manufacturing the light-receiving element illustrated in FIG. 1.

FIG. 6A is a cross-sectional view of a process subsequent to that illustrated in FIG. 5.

FIG. 6B is a cross-sectional view of a process subsequent to that illustrated in FIG. 6A.

FIG. 7 is a cross-sectional view of a process subsequent to that illustrated in FIG. 6B.

FIG. 8 is a cross-sectional view of a process subsequent to that illustrated in FIG. 7.

FIG. 9 is a cross-sectional view of a process subsequent to that illustrated in FIG. 8.

FIG. 10A is a cross-sectional view of a configuration of a light-receiving element according to Comparative Example 1.

FIG. 10B is a cross-sectional view of a configuration of a light-receiving element according to Comparative Example 2.

FIG. 11 is a cross-sectional view of a configuration of a light-receiving element according to a second embodiment of the disclosure.

FIG. 12 is a cross-sectional view of a process of a method of manufacturing the light-receiving element illustrated in FIG. 11.

FIG. 13 is a cross-sectional view of a process subsequent to that illustrated in FIG. 12.

FIG. 14A is a cross-sectional view of a process subsequent to that illustrated in FIG. 13.

FIG. 14B is a cross-sectional view of a process subsequent to that illustrated in FIG. 14A.

FIG. 15 is a cross-sectional view of a process subsequent to that illustrated in FIG. 14B.

FIG. 16A is a cross-sectional view of a process subsequent to that illustrated in FIG. 15.

FIG. 16B is a cross-sectional view of a process subsequent to that illustrated in FIG. 16A.

FIG. 17 is a block diagram illustrating a configuration of an imaging device.

FIG. 18 is a schematic diagram illustrating a configuration example of a laminated imaging device.

FIG. 19 is a functional block diagram illustrating an example of an electronic apparatus (camera) using the imaging device illustrated in FIG. 17.

MODES FOR CARRYING OUT THE INVENTION

Figure 1:
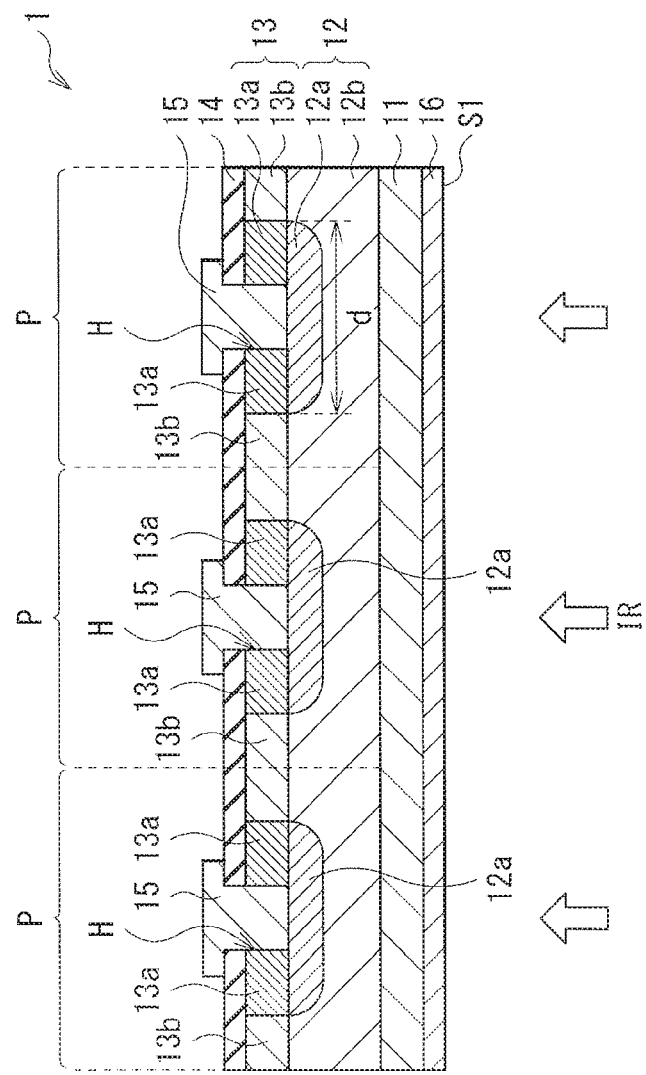
FIG. 1 is a cross-sectional view of a configuration of a light-receiving element according to a first embodiment of the disclosure.

Some embodiments of the disclosure are described in detail below with reference to drawings. It is to be noted that the description is given in the following order.

1. First Embodiment (An example of a light-receiving element in which an electrode is formed by an opening in a cap layer being buried)
2. Second Embodiment (An example of a light-receiving element in which an insulating film is formed on an inner side of an opening in a cap layer)
3. Application Example 1 (An example of an imaging device)
4. Application Example 2 (An example of an electronic apparatus)

First Embodiment

[Configuration]

FIG. 1 illustrates a cross-sectional configuration of a light-receiving element (a light-receiving element 1) according to a first embodiment of the disclosure. The light-receiving element 1 is applied to a device such as an infrared sensor using a compound semiconductor (a group III-V semiconductor), for example, and includes a plurality of light-receiving unit regions (hereinafter, referred to "pixel P") that are two-dimensionally disposed, for example. It is to be noted that FIG. 1 illustrates a cross-sectional configuration of a portion corresponding to three pixels P.

The light-receiving element 1 includes, for example, a photoelectric conversion layer 12 and a cap layer 13 (semiconductor layer), which are provided in this order, on a substrate 11. A first electrode 15 is electrically coupled to a selective region (a first conductivity-type layer 12a) of the photoelectric conversion layer 12 that is provided on the side on which the cap layer 13 is located. A second electrode 16 is provided, for example, on the light incidence side of the substrate 11. A protective layer 14 which serves as a passivation film of the light-receiving element 1 is provided on the cap layer 13. In this light-receiving element 1, for example, the back face of the second electrode 16 serves as a light incidence face (face S1) (infrared light IR is configured to enter from the side on which the second electrode 16 is located). Hereinafter, descriptions are given of configurations of respective components.

It is to be noted that an on-chip lens (not illustrated), etc. may be further provided on the face S1 side of the second electrode 16. Further, color filters may be disposed in a case of detecting not only infrared light but also visible light. Further, a silicon semiconductor substrate on which a pixel circuit and various types of wiring, etc. for reading of signals from each pixel P are formed is stacked on the protective layer 14 and the first electrode 15. The first electrode 15 and the second electrode 16 are electrically coupled to various circuits formed on the silicon semiconductor substrate through a bump or a via, for example.

The substrate 11 includes an n-type or i-type (intrinsic semiconductor) InP, for example. Here, although the photoelectric conversion layer 12 is so formed as to be in contact with the substrate 11 on the substrate 11, another layer may be interposed between the substrate 11 and the photoelectric conversion layer 12. Examples of the material for the layer interposed between the substrate 11 and the photoelectric conversion layer 12 include, for example, semiconductor materials such as InAlAs, Ge, Si, GaAs, and InP. However, it is desirable that materials that causes lattice match between the substrate 11 and the photoelectric conversion layer 12 be selected.

The photoelectric conversion layer 12 includes a compound semiconductor (first compound semiconductor) that absorbs, for example, a wavelength in an infrared region (hereinafter, referred to as infrared light) to generate electric charges (electrons and holes). Here, the photoelectric conversion layer 12 is provided continuously, as a common layer, on the substrate 11 with respect to a plurality of pixels P (or a plurality of first electrodes 15).

The compound semiconductor used for the photoelectric conversion layer 12 is $In_xGa_{(1-x)}As(x: 0 < x \leq 1)$, for example. However, in order to obtain higher sensitivity in an infrared region, $x \geq 0.4$ is desirable. An example of composition of a compound semiconductor for the photoelectric conversion layer 12 causing lattice match with the substrate 11 including InP includes $In_{0.53}Ga_{0.47}As$.

The first conductivity-type layer 12a is provided in a selective region of this photoelectric conversion layer 12 on the side on which the cap layer 13 is located. The first conductivity-type layer 12a is provided for each pixel P. In other words, a plurality of first conductivity-type layers 12a are each provided in a manner to be distributed and separated from each other in the photoelectric conversion layer 12.

The first conductivity-type layer 12a is a region including a p-type impurity, for example. Examples of the p-type impurity include zinc (Zn), and the like. This first conductivity-type layer 12a is formed in a manner to extend from the face of the photoelectric conversion layer 12 on the side on which the cap layer 13 is located to a predetermined depth location. The photoelectric conversion layer 12 involves a p-n junction or a p-i-n junction owing to the stacking of the first conductivity-type layer 12a and a region other than this first conductivity-type layer 12a (second conductivity-type layer 12b). The second conductivity-type layer 12b is a region including an n-type impurity, for example. Examples of the n-type impurity include silicon (Si), and the like. However, this second conductivity-type layer 12b may include an intrinsic semiconductor (may be an i-type semiconductor region).

The cap layer 13 is provided between the photoelectric conversion layer 12 and the first electrode 15. It is desirable that this cap layer 13, although described later in detail, serve to electrically separate pixels or suppress the generation of a dark current. It is desirable that the cap layer 13 include a compound semiconductor (the second compound semiconductor) having a larger bandgap than that of the photoelectric conversion layer 12. An example of a compound semiconductor having a larger bandgap than $In_{0.53}Ga_{0.47}As$ (bandgap 0.74 eV) includes Inp (bandgap 1.34 eV) and InAlAs. It is to be noted that a layer including a semiconductor of either InAlAs, Ge, Si, GaAs or InP, for example, may be further interposed between the cap layer 13 and the photoelectric conversion layer 12.

This cap layer 13 includes a first conductivity-type region 13a that faces the first conductivity-type layer 12a of the photoelectric conversion layer 12, and has an opening H in the selective region of this first conductivity-type region 13a. In other words, the first conductivity-type region 13a and the opening H are each provided for each pixel P. The opening H is formed in a manner to penetrate the cap layer 13, which allows, for example, a surface of the photoelectric conversion layer 12 to be exposed.

FIG. 2 is a diagram illustrating a configuration of the opening H, and FIGS. 3A and 3B illustrate a detailed configuration of a region A in FIG. 2. As illustrated in FIG. 3A, in the proximity of the opening H, an end 14e of the protective layer 14 is provided to protrude (to be projected) further from the side face of the opening H (a side wall 13a1 of the first conductivity-type region 13a). In other words, the end 14e of the protective layer 14 is formed in an eave shape in the proximity of the opening H. Alternatively, as illustrated in FIG. 3B, the side face of the opening H may have an inclined face 13a2. The inclined face 13a2 has a forwardly tapered shape, and is inclined to allow opening area thereof to gradually become smaller from the face on the protective layer 14 side toward the face on the photoelectric conversion layer 12 side. In this way, the protective layer 14 may be formed in an eave shape in the proximity of the opening H, or the side face of the opening H may has the inclined face 13a2. However, as illustrated in FIG. 3B, it is desirable that the opening H have the inclined face 13a2. This is because the coverage of the first electrode 15 with respect to the side wall of the first conductivity-type region 13a becomes more favorable.

A second conductivity-type region 13b is formed around this first conductivity-type region 13a in such a manner as to be adjacent to the first conductivity-type region 13a.

The first conductivity-type region 13a is a region including a p-type impurity, for example. Examples of the p-type impurity include zinc (Zn), and the like. This first conductivity-type region 13a and the first conductivity-type layer 12a each have the same impurity, for example, and also have substantially the same width (width d). Although described in detailed later, this is because the first conductivity-type layer 12a and the first conductivity-type region 13a are formed collectively through a process of the same impurity diffusion. In the cap layer 13, the first conductivity-type region 13a is formed in a manner to surround the opening H along the horizontal direction (a direction parallel to the substrate 11), and the second conductivity-type region 13b is formed in a manner to surround this first conductivity-type region 13a. The second conductivity-type region 13b is a region including an n-type impurity, for example. Examples of the n-type impurity include silicon (Si), and the like.

In the cap layer 13, the boundary between these first conductivity-type region 13a and second conductivity-type region 13b, i.e., the formation of the first conductivity-type region 13a and the second conductivity-type region 13b in a manner to be adjacent in the horizontal direction provides a p-n junction interface. This makes it possible to electrically separate the adjacent pixels P from each other.

The protective layer 14 is formed in a manner to cover a region except for the opening H on the cap layer 13. This protective layer 14 is used as a hard mask, for example, in the impurity diffusion process and the formation process of the opening H which are described later. The protective layer 14 includes, for example, at least one of inorganic insulating materials such as silicon nitride (SiN), aluminium oxide ($Al_2O_3$), and hafnium oxide ($HfO_2$).

As illustrated in FIG. 4, this protective layer 14 is formed in such a manner as to be in contact with the boundary (boundary B) between the first conductivity-type region 13a and the second conductivity-type region 13b of the cap layer 13.

The first electrode 15 is an electrode to which a voltage for reading of electric charges (for example, holes) generated in the photoelectric conversion layer 12 is supplied, and is provided for each pixel P. Examples of a material for configuring this first electrode 15 include an either simple substance among titanium (Ti), tungsten (W), titanium nitride (TiN), platinum (Pt), gold (Au), germanium (Ge), nickel (Ni), and aluminum (Al), or an alloy that contains at least one from thereamong. This first electrode 15 corresponds to one specific example of "electrode" of the disclosure.

This first electrode 15 is so formed as to bury the opening Hand as to be electrically coupled to the first conductivity-type layer 12a of the photoelectric conversion layer 12. Here, the first electrode 15 buries the opening H, and is in direct contact with the surface of the first conductivity-type layer 12a. Further, although the first electrode 15 is provided for each pixel P, as in the present embodiment, a single first electrode 15 may be provided for a single pixel P, or the plurality of first electrodes 15 may be provided for a single pixel P. Further, in a case where the plurality of first electrodes 15 are provided for a single pixel P, an electrode (dummy electrode) that does not practically contribute to the extraction of electrical charges may be included in a portion thereof.

The second electrode 16 is provided on the back face of the substrate 11 (the face on the light incidence side), as a electrode common to each pixel P, for example. It is to be noted that, in a case where, for example, holes among the electric charges generated in the photoelectric conversion layer 12 is read as signal electric charges through the first electrode 15, it is possible to discharge electrons, for example, through this second electrode 16. Further, so long as the second electrode 16 is electrically coupled to the substrate 11, the second electrode 16 may not be formed necessarily over the entire back face of the substrate 11. Alternatively, no second electrode 16 may be provided.

This second electrode 16 includes an electrically conductive film that allows for the transmission of light of a wavelength in an infrared region, for example.

[Method of Manufacturing]

It is possible to manufacture the light-receiving element 1 as follows, for example. FIGS. 5, 6A, 6B, 7, 8, and 9 illustrate manufacturing processes of the light-receiving element 1 in order of processes.

First, as illustrated in FIG. 5, a compound semiconductor layer 120 containing InGaAs, for example, and a compound semiconductor layer 130 containing InP, for example, are grown epitaxially in order on a face of the substrate 11 including InP, for example. During this growth process, gas, etc. containing an n-type impurity, for example, is introduced, thereby forming films of the respective compound semiconductor layers 120 and 130 as n-type layers.

Next, the protective layer 14 is formed on the compound semiconductor layer 130. Specifically, as illustrated in FIG. 6A, first, a film of the protective layer 14 including the above-described materials is formed through, for example, a plasma CVD (Chemical Vapor Deposition) method, a thermal CVD method, an ALD (Atomic Layer Deposition) method, or a sputtering method. Thereafter, as illustrated in FIG. 6B, an opening h1 is formed on the protective layer 14 by etching using a lithography method. The opening h1 is formed for each pixel forming region p1 (a region where a pixel P is formed).

Thereafter, as illustrated in FIG. 7, for example, a p-type impurity (for example, zinc) is caused to diffuse, by, for example, vapor phase diffusion, to the compound semiconductor layers 120 and 130 with the protective layer 14 as a mask (through the opening h1). At this time, gas such as DMZn (Di-Methyl Zinc) is used, and the process temperature at this time can be set to approximately 500° C., for example. In this way, the first conductivity-type layer 12a and the first conductivity-type region 13a are collectively (simultaneously) formed. Further, the portion of the compound semiconductor layer 120 except for the first conductivity-type layer 12a becomes the second conductivity-type layer 12b. The portion of the compound semiconductor layer 130 except for the first conductivity-type region 13a becomes the second conductivity-type region 13b. In this way, the photoelectric conversion layer 12 including the p-n junction of the first conductivity-type layer 12a and the second conductivity-type layer 12b is formed, and the p-n junction (boundary B) of the first conductivity-type region 13a and the second conductivity-type region 13b is formed on the photoelectric conversion layer 12. It is to be noted that, in addition to vapor phase diffusion, the first conductivity-type layer 12a and the first conductivity-type region 13a may be formed through, for example, solid-phase diffusion or ion implantation.

Next, as illustrated in FIG. 8, by etching the first conductivity-type region 13a with the protective layer 14 as a mask, the opening H is formed for each pixel forming region p1. At this time, it is possible to make a side wall of the first conductivity-type region 13a in a forwardly tapered shape by using a wet process (the inclined face 13a2 illustrated in FIG. 3B is formed on the side face of the opening H). Specifically, wet etching is performed by using a chemical that is able to obtain etching selectivity with InGaAs, such as a mixed liquid of hydrochloric acid and hydrogen peroxide or a mixed liquid of citric acid and hydrogen peroxide. However, the disclosure is not limited to such a wet process, and a dry process (dry etching) may be used. Further, as illustrated in FIG. 3A, along with the opening H, the end 14e of the protective layer 14 may be formed in an eave shape. In this way, it is possible to form the photoelectric conversion layer 12 and the cap layer 13.

Thereafter, as illustrated in FIG. 9, the first electrode 15 is formed. Specifically, the first electrode 15 including the above-described material is so formed as to bury the opening H on the protective layer 14 by, for example, a CVD method, a PVD (Physical Vapor Deposition) method, an ALD method, and an evaporation method, following which patterning is performed by means of etching that utilizes a lithography method. In this way, the first electrode 15 is formed for each pixel P.

Thereafter, the second electrode 16 is formed on the back face side of the substrate 11 through, for example, a CVD method, a PVD method, an ALD method, and an evaporation method. In addition, color filters, an on-chip lens, etc. are formed as necessary. This completes the light-receiving element 1 as illustrated in FIG. 1.

Workings and Effects

According to the light-receiving element 1 of the present embodiment, once infrared light IR enters the photoelectric conversion layer 12 through the second electrode 16 and the substrate 11, this infrared light IR is absorbed in the photoelectric conversion layer 12. In this way, a pair of a hole (hole) and an electron is generated (photoelectric conversion is caused) in the photoelectric conversion layer 12. At this time, when a predetermined voltage is applied to the photoelectric conversion layer 12 through the first electrode 15 and the second electrode 16, for example (a potential gradient is formed), one electric charge (here, a hole) of the generated electric charges is collected, as a signal charge, to the first electrode 15 side. This signal charge is read by the unillustrated pixel circuit through the first electrode 15.

It is to be noted that, in a case where no second electrode 16 is provided, a voltage may be so applied to the first electrode 15 as to allow a potential gradient to be formed between the first electrode 15 and the substrate 11. However, providing the second electrode 16 makes it easier to form the potential gradient larger and makes it possible to discharge the other electric charge (here, electron) of the electric charges generated by the photoelectric conversion from the photoelectric conversion layer 12 through the second electrode 16.

In this light-receiving element 1, the cap layer 13 including the second compound semiconductor (for example, InP) is formed on the photoelectric conversion layer 12 including the first compound semiconductor (for example, the group III-V semiconductor such as InGaAs), and the opening H is provided in the selective region of the cap layer 13. The first electrode 15 is provided by burying this opening H and being electrically coupled to the photoelectric conversion layer 12.

Here, FIG. 10A illustrates a cross-sectional configuration of a light-receiving element 100A according to a comparative example (Comparative Example 1) of the present embodiment. It is to be noted that FIG. 10A illustrates only a region corresponding to a single pixel. In the light-receiving element 100A, a photoelectric conversion layer 102 including InGaAs and a cap layer 103 including InP are stacked on a substrate 101 including InP. A protective layer 104 having an opening h1 is provided on the cap layer 103, and a first electrode 105 is electrically coupled to the cap layer 103 via this opening h1.

In this light-receiving element 100A, the cap layer 103 includes a p-type region 103a and an n-type region 103b. In this way, a p-n junction interface is formed (by p-n separation), which makes it possible to electrically separate adjacent pixels from each other. Therefore, it is possible to prevent signal charges from intruding into adjacent pixels. However, in the light-receiving element 100A of this comparative example 1, InP (a p-type region 103a) is interposed between the first electrode 105 and the photoelectric conversion layer 102, making it difficult to ensure ohmic contact therebetween (contact resistance becomes large). This consequently makes it difficult for a desirable voltage to be applied to the photoelectric conversion layer 102, thereby leading to the reduction in the characteristics of a photodiode (current-voltage characteristics).

In contrast, according to the present embodiment, since the opening H is provided in the cap layer 13 and the first electrode 15 is electrically coupled to the photoelectric conversion layer 12 via this opening H, as described above, making it possible to ensure ohmic contact. Hence, it is possible to reduce contact resistance further than the above-described Comparative Example 1 is enabled.

Here, FIG. 10B illustrates a cross-sectional configuration of a light-receiving element 100B according to Comparative Example 2 of the present embodiment. In the light-receiving element 100B, a photoelectric conversion layer 108 including an n-type InGaAs and a cap layer 109 including InGaAsP are stacked on a substrate 107 including InP. A protective layer 110 (SiN) having an opening h1 is provided on the cap layer 109, and a first electrode 111 is electrically coupled to the cap layer 109 via this opening h1. In this light-receiving element 100B as well, the cap layer 109 includes a p-type region 109a and an n-type region 109b, thereby forming a p-n junction interface, making it possible to electrically separating adjacent pixels from each other. Further, in the light-receiving element 100B, the InGaAsP that configures the cap layer 109 has a relatively small contact resistance, making it possible to reduce the contact resistance.

However, typically, a fault is likely to occur on the interface of the group III-V semiconductor and an insulating film. Further, since the bandgap of the group III-V semiconductor is relatively small, an interface recombination rate increases. In view of these, a dark current is likely to be generated in the proximity of the interface of the group III-V semiconductor and the insulating film. For this reason, in the light-receiving element 100B of Comparative Example 2, the protective layer 110 including SiN and the cap layer 109 including InGaAsP come into contact with each other. This leads to easier generation of a fault at the interface therebetween, and thus a dark current is generated. Therefore, in the device structure using the group III-V semiconductor, it is difficult to reduce contact resistance while suppressing a dark current. Suppression of the dark current is desirable in that the dark current becomes noise in a light receiving signal.

In contrast, according to the present embodiment, the cap layer 13, interposed between the photoelectric conversion layer 12 including the group III-V semiconductor (for example, InGaAs) and the protective layer 14, includes a compound semiconductor (for example, InP) having a larger bandgap than that of the photoelectric conversion layer 12, for example. In this way, the interface recombination rate is reduced, which makes it possible to suppress the generation of a dark current.

Further, for example, the n-type second conductivity-type region 13b is formed around the p-type first conductivity-type region 13a, for example in the cap layer 13 according to the present embodiment. In other words, the cap layer 13 includes the p-n junction interface (the boundary B in FIG. 4) between the first conductivity-type region 13a and the second conductivity-type region 13b, whereby this boundary B is in contact with the protective layer 14. Here, a dark current is generated also in a case where the above-described interface fault comes into contact with a depletion layer generated at the p-n junction interface; however, the light-receiving element 1 according to the present embodiment has the structure in which the depletion layer is not in contact with the interface having many faults, whereby a dark current is unlikely to be generated.

That is to say, according to the present embodiment, the structure in which the first electrode 15 buries the opening H of the cap layer 13 and the p-n junction interface (the boundary B) in the cap layer 13 is in contact with the protective layer 14 is achieved, whereby it is possible to suppress the generation of a dark current at the interface with the protective layer 14 while sufficiently reducing contact resistance.

Further, in a case where the light-receiving element 1 includes the pixels P as a plurality of light-receiving unit regions, the first conductivity-type layer 12a of the photoelectric conversion layer 12 and the first conductivity-type region 13a of the cap layer 13 are each provided for each pixel P. Since the second conductivity-type region 13b is formed around the first conductivity-type region 13a in the cap layer 13, the p-n junction interface is formed (by p-n separation) by the boundary (the boundary B of FIG. 4), which makes it possible to electrically separate adjacent pixels P from each other.

Moreover, it is possible to collectively (simultaneously) form the first conductivity-type layer 12a of the photoelectric conversion layer 12 and the first conductivity-type region 13a of the cap layer 13 through a impurity diffusion process with the protective layer 14 as a mask. In other words, the first conductivity-type layer 12a and the first conductivity-type region 13a are each formed in a manner to include the same impurity each other.

As described above, according to the present embodiment, the cap layer 13 including the second compound semiconductor is formed on the photoelectric conversion layer 12 including the first compound semiconductor, and the opening H is provided in the selective region of this cap layer 13. Since the first electrode 15 for reading of signal charges buries the opening H of the cap layer 13 and is electrically coupled to the photoelectric conversion layer 12, it is possible to reduce contact resistance. Consequently, it is possible to maintain favorable characteristics of a photodiode.

Next, descriptions will be given of another embodiment other than the above-described first embodiment. In the following, components similar to those of the above-described first embodiment are denoted with the same reference numerals, and the descriptions thereof are omitted where appropriate.

Second Embodiment

FIG. 11 illustrates a cross-sectional configuration of a light-receiving element (light-receiving element 1A) according to the second embodiment of the disclosure. Similarly to the light-receiving element 1 according to the above-described first embodiment, the light-receiving element 1A according to the present embodiment is applied to a device such as an infrared sensor using the compound semiconductor (the group III-V semiconductor), for example, and includes, for example, a plurality of light-receiving unit regions (pixels P) that are two-dimensionally disposed, for example. It is to be noted that FIG. 11 illustrates a cross-sectional configuration of a portion corresponding to a single pixel P.

Similarly to the light-receiving element 1 according to the above-described first embodiment, in the light-receiving element 1A, a photoelectric conversion layer 12 and a cap layer 13 are formed on a substrate 11. A second electrode 16 is formed on the back face side of the substrate 11, and the back face of this second electrode 16 corresponds to a face S1. The photoelectric conversion layer 12 includes the first conductivity-type layer 12a and the second conductivity-type layer 12b, and the cap layer 13 includes the first conductivity-type region 13a and the second conductivity-type region 13b. The opening H is formed in the first conductivity-type region 13a of the cap layer 13, and the first electrode 15 is formed in a manner to bury this opening H. A protective layer 22 is provided on the cap layer 13, and a boundary B1 between the first conductivity-type region 13a and the second conductivity-type region 13b in the cap layer 13 is in contact with the protective layer 22.

However, the present embodiment is different from the above-described first embodiment, and an insulating film 21 is formed in a manner to cover a side face (inner face) of the opening H of the cap layer 13. Specifically, the insulating film 21 is formed in a manner to cover a side wall of the first conductivity-type region 13a of the cap layer 13. In other words, the insulating film 21 is interposed between the first electrode 15 and the first conductivity-type region 13a in a direction parallel to the substrate 11 (horizontal direction).

The insulating film 21 serves as a so-called side wall. This insulating film 21 includes at least one of inorganic insulating materials such as silicon nitride, aluminium oxide, and hafnium oxide, for example.

Similarly to the protective layer 14 according to the above-described first embodiment, the protective layer 22 includes, for example, at least one of inorganic insulating materials such as silicon nitride, aluminium oxide, and hafnium oxide, for example, or a high dielectric material. However, different from the protective layer 14 according to the above-described first embodiment, this protective layer 22 is formed in a manner to cover an upper face of the cap layer 13 and a portion of an upper face of the first electrode 15, and has an opening h2 that faces the first electrode 15.

It is possible to manufacture the above-described light-receiving element 1A as follows, for example. FIGS. 12, 13, 14A, 14B, 15, 16A, to and 16B illustrate manufacturing processes of the light-receiving element 1A in order of processes.

First, similarly to the above-describe first embodiment, the n-type compound semiconductor layer 120, for example, and the n-type compound semiconductor layer 130, for example, are formed by being caused to perform an epitaxial growth in order on a face of the substrate 11 including InP, for example. Thereafter, as illustrated in FIG. 12, for example, a p-type impurity is caused to diffuse into the compound semiconductor layers 120 and 130 using a hard mask layer 210 having an opening h3 in a similar method to that of the above-described first embodiment. In this way, the first conductivity-type layer 12a and the first conductivity-type region 13a are collectively formed. A similar material to that of the protective layer 14 of the above-described first embodiment, for example, is used for the hard mask layer 210. After forming a film of such a material through, for example, a plasma CVD method, a thermal CVD method, an ALD method, or a sputtering method, it is possible to form the opening h3 by etching using a lithography method.

Next, as illustrated in FIG. 13, similarly to the above-described first embodiment, the opening H is formed by etching the first conductivity-type region 13a using the hard mask layer 210. In this way, the photoelectric conversion layer 12 and the cap layer 13 are formed. Thereafter, the hard mask layer 210 is removed. In a case of the hard mask layer 210 including SiN, it is possible to remove the hard mask layer 210 by wet etching using a hydrogen fluoride-based chemical, for example.

Thereafter, as illustrated in FIG. 14A, an insulating film 21 (insulating film 21a) including the above-described material is formed on the cap layer 13. At this time, the insulating film 21A is formed in a manner to cover an upper face of the cap layer 13 and a side face of the opening H. Examples of a film forming method include a plasma CVD method, a thermal CVD method, an ALD method, and a sputtering method.

Thereafter, as illustrated in FIG. 14B, portions other than the portion of the side face of the opening H of the insulating film 21a thus formed (the respective portions facing the upper face of the cap layer 13 and a bottom face of the opening H) are selectively removed. In this way, the insulating film 21 that serves as a side wall is formed.

Next, a first electrode 15 is formed as illustrated in FIG. 15. Specifically, similarly to the above-described first embodiment, the first electrode 15 including the above-described material is so formed as to bury the opening H provided on the cap layer 13 by, for example, a CVD method, a PVD method, an ALD method, or a sputtering method, following which the patterning is performed by means of by etching that utilizes a lithography method.

Thereafter, as illustrated in FIG. 16A, a protective layer 22 including the above-described material is formed in a manner to cover the first electrode 15 and the cap layer 13. Examples of a film forming method include a plasma CVD method, a thermal CVD method, an ALD method, and a sputtering method.

Thereafter, as illustrated in FIG. 16B, an opening h2 is formed by etching the protective layer 22 using a lithography method, for example. It is to be noted that, similarly to the above-described first embodiment, the second electrode 16 is formed on the back face side of the substrate 11 in the present embodiment as well. This completes the light-receiving element 1A illustrated in FIG. 11.

In the light-receiving element 1A according to the present embodiment, similarly to the light-receiving element 1 according to the above-described embodiment, once infrared light IR enters the photoelectric conversion layer 12, this infrared light IR is absorbed in the photoelectric conversion layer 12, and is subjected to photoelectric conversion. At this time, a predetermined voltage is applied to the photoelectric conversion layer 12 through the first electrode 15 and the second electrode 16, for example, and signal charges are read through the first electrode 15.

In this light-receiving element 1A as well, the cap layer 13 formed on the photoelectric conversion layer 12 has the opening H, and the first electrode 15 is provided in a manner to bury this opening H. In this way, with the above-described reasons, it is possible to reduce contact resistance. Consequently, it is possible to acquire an effect equivalent to that of the above-described first embodiment.

Further, the cap layer 13 that is interposed between the photoelectric conversion layer 12 including the group III-V semiconductor (for example, InGaAs) and the protective layer 14 includes a compound semiconductor (for example, InP) having a larger bandgap than that of the photoelectric conversion layer 12, for example. In this way, the interface recombination rate is reduced, which makes it possible to suppress the generation of a dark current. In addition, the boundary B1 between the first conductivity-type region 13a and the second conductivity-type region 13b in the cap layer 13 is in contact with the protective layer 22, and the light-receiving element 1A has the structure in which the depletion layer is not in contact with the interface having many faults, and thus a dark current is unlikely to be generated. Consequently, in the light-receiving element 1A according to the present embodiment as well, similarly to the above-described first embodiment, it is possible to suppress the generation of a dark current at the interface with the protective layer 14 while sufficiently reducing contact resistance.

In addition, since the insulating film 21 is formed on the side face of the opening H, the present embodiment further involves the following effect. That is to say, a predetermined voltage is applied to the first electrode 15 for reading of signals, and, due to this voltage application, a depletion layer is likely to broaden in the proximity of the side face of the opening H (the region between the first electrode 15 and the first conductivity-type region 13a of the cap layer 13). Since the insulating film 21 is provided on the side face of the opening H, i.e. between the first electrode 15 and the side wall of the first conductivity-type region 13a, it is possible to suppress broadening of such a depletion layer, which makes it possible to suppress the generation of a dark current.

Application Example 1

FIG. 17 illustrates a functional configuration of an imaging device 2 using the element structure of the light-receiving element 1 described in the above-described first embodiment, etc. The imaging device 2 is, for example, an infrared image sensor, and includes, for example, a pixel section 10 and a circuit section 20 that drives this circuit section 20. The circuit section 20 includes, for example, a row scanning section 131, a horizontal selection section 133, a column scanning section 134, and a system controller 132.

The pixel section 10 includes a plurality of pixels P that are two-dimensionally arranged in rows and columns, for example. In this pixel P, a pixel driving line Lread (for example, a row selection line and a reset control line) is wired for each pixel row, and a vertical signal line Lsig is wired for each pixel column, for example. The pixel driving line Lread transmits a drive signal for reading of a signal from the pixel P. On end of the pixel driving line Lread is coupled to an output terminal corresponding to each row of the row scanning section 131.

The row scanning section 131 includes, for example, a shift register, or an address decoder, and serves as a pixel driver that drives each pixel P of the pixel section 10 on a row basis, for example. Signals outputted from each pixel P in the pixel row that is scanned and selected by the row scanning section 131 are supplied to the horizontal selection section 133 through the respective vertical signal lines Lsig. The vertical selection section 133 includes, for example, an amplifier or a horizontal selection switch provided for each of the vertical signal lines Lsig.

The column scanning section 134 includes, for example, a shift register or an address decoder, and drives each of the horizontal selection switches of the horizontal selection section 133 in order while scanning each of the horizontal selection switches. The selection and scanning by the column scanning section 134 allow the signal of each pixel transmitted through each of the respective vertical signal lines Lsig to be sequentially outputted to a horizontal signal line 135, and inputted to an unillustrated signal processor, etc. through the horizontal signal line 135.

In this imaging device 2, as illustrated in FIG. 18, a substrate 2A including the pixel section 10 and a substrate 2B including the circuit section 20 are stacked, for example. However, the disclosure is not limited to such a configuration; the circuit section 20 may be formed on the same substrate as the pixel section 10, or may be disposed in an external control IC. Alternatively, the circuit section 20 may be provided in another substrate that is coupled by means of a cable, etc.

The system controller 132 receives a clock provided from outside, data that instructs an operation mode, and the like, and also outputs data such as internal information of the imaging device 2. The system controller 132 further includes a timing generator that generates various types of timing signals to perform control of driving the row scanning section 131, the horizontal selection section 133, the column scanning section 134, and the like, on the basis of the various types of timing signals that are generated by the timing generator.

Application Example 2

The above-described imaging device 2 is applicable to various types of electronic apparatuses, such as a camera that enables imaging of a infrared region, for example. As an example, FIG. 19 illustrates a schematic configuration of an electronic apparatus 3 (camera). This electronic apparatus 3 is a camera that enables shooting of a still image or a moving image, for example, and includes the imaging device 2, an optical system (optical lens) 310, a shutter unit 311, a driver 313 that drives the imaging device 2 and the shutter unit 311, and a signal processor 312.

The optical system 310 guides image light (incident light) from an object to the imaging device 2. This optical system 310 may include a plurality of optical lenses. The shutter unit 311 controls a period in which the imaging device 2 is irradiated with light and a period in which the light is blocked with respect to the imaging device 2. The driver 313 controls a transfer operation of the imaging device 2 and a shutter operation of the shutter unit 311. The signal processor 312 performs various types of signal processes for signals outputted from the imaging device 2. An image signal Dout after signal processing is stored in a storage medium such as memory or outputted to a monitor, for example.

Although the descriptions are provided by way of the embodiments and application examples as described above, the contents of the disclosure are not limited to the above-described embodiments and may be variously modified. For example, the layer configurations of the light-receiving elements described in the above-described embodiments are merely exemplified, and may further include another layer. Further, the respective materials and the thickness of each layer are also merely exemplified, and thus are not limited to the above-described ones.

Further, in the above-described embodiments, etc., although "first conductivity-type layer" and "first conductivity-type region" of the disclosure are described as a p-type layer (region), and "second conductivity-type layer" and "second conductivity-type region" are described as an n-type layer (region), the disclosure is not limited to these combinations. That is to say, depending on the types of a compound semiconductor and an impurity (dopant) used for the light-receiving element, "first conductivity-type layer" and "first conductivity-type region" may be an n-type ones, and "second conductivity-type layer" and "second conductivity-type region" may be a p-type ones.

It is to be noted that the effects described in the above-described embodiments are merely exemplified, and another additional effect may be included. Further, the disclosure may have the following configurations.

(1)
A light-receiving element including:
a substrate;
a photoelectric conversion layer that is provided on the substrate and includes a first compound semiconductor, and absorbs a wavelength in an infrared region to generate electric charges;
a semiconductor layer that is provided on the photoelectric conversion layer and includes a second compound semiconductor, and has an opening in a selective region; and
an electrode that buries the opening of the semiconductor layer and is electrically coupled to the photoelectric conversion layer.

(2)
The light-receiving element according to (1), in which
the photoelectric conversion layer includes a first conductivity-type layer in a selective region on a side on which the semiconductor layer is located, and
the semiconductor layer includes:
a first conductivity-type region that is provided to face the first conductivity-type layer and has the opening; and
a second conductivity-type region that is provided around the first conductivity-type region.

(3)
The light-receiving element according to (1) or (2), further including a protective layer that includes an insulating material on the semiconductor layer, in which
the second compound semiconductor has a larger bandgap than that of the first compound semiconductor.

(4)
The light-receiving element according to (3), in which
the photoelectric conversion layer includes a first conductivity-type layer in the selective region on a side on which the semiconductor layer is located,
the semiconductor layer includes:
a first conductivity-type region that is provided to face the first conductivity-type layer and has the opening; and
a second conductivity-type region that is provided around the first conductivity-type region, and
a boundary between the first conductivity-type region and the second conductivity-type region is in contact with the protective layer.

(5)
The light-receiving element according to (2), comprising a plurality of pixels, in which
the first conductivity-type layer and the first conductivity-type region are each provided for each of the pixels, and
the pixels that are adjacent to each other are electrically separated from each other by a boundary between the first conductivity-type region and the second conductivity-type region.

(6)
The light-receiving element according to (2) or (5), in which the first conductivity-type layer and the first conductivity-type region have same impurity as each other.

(7)
The light-receiving element according to any one of (1) to (6), in which an insulating film is provided to cover an inner face of the opening of the semiconductor layer.

(8)
The light-receiving element according to any one of (1) to (7), in which a side face of the opening of the semiconductor includes an inclined face.

(9)
The light-receiving element according to any one of (1) to (8), in which the first compound semiconductor includes $In_xGa_{(1-x)}As(x:0<x\leq1)$.

(10)
The light-receiving element according to (9), in which the second compound semiconductor includes InP or InAlAs.

(11)
The light-receiving element according to any one of (1) to (10), further including another electrode that is electrically coupled to the substrate.

(12)
A method of manufacturing a light-receiving element, the method including steps of:
forming, on a substrate,
a photoelectric conversion layer that includes a first compound semiconductor, and absorbs a wavelength in an infrared region to generate electric charges, and
a semiconductor layer that includes a second compound semiconductor, and has an opening in a selective region; and
forming, on the substrate, an electrode that buries the opening of the semiconductor layer and is electrically coupled to the photoelectric conversion layer.

(13)
The method of manufacturing the light-receiving element according to (12), in which
the photoelectric conversion layer includes a first conductivity-type layer in a selective region on a side on which the semiconductor layer is located,
the semiconductor layer includes:
a first conductivity-type region that is provided to face the first conductivity-type layer and has the opening; and
a second conductivity-type region that is provided around the first conductivity-type region.

(14)
The method of manufacturing the light-receiving element according to (12) or (13), in which
a protective layer including an insulating material is further provided on the semiconductor layer, and
the second compound semiconductor has a larger bandgap than that of the first compound semiconductor.

(15)
The method of manufacturing the light-receiving element according to (14), in which the photoelectric conversion layer includes a first conductivity-type layer in the selective region on a side on which the semiconductor layer is located, the semiconductor layer includes:

a first conductivity-type region that is provided to face the first conductivity-type layer and has the opening; and a second conductivity-type region that is provided around the first conductivity-type region, and a boundary between the first conductivity-type region and the second conductivity-type region is in contact with the protective layer.

(16)

The method of manufacturing the light-receiving element according to (14) or (15), in which the step of forming the photoelectric conversion layer and the semiconductor layer includes:

forming the first and second compound semiconductors in order on the substrate, followed by forming the protective layer thereon, and forming, with the protective layer as a mask, the first conductivity-type layer and the first conductivity-type region by diffusing an impurity in selective regions of the first and the second compound semiconductors.

(17)

The method of manufacturing the light-receiving element according to (16), including: forming the opening by etching the semiconductor layer with the protective layer as a mask.

(18)

The method of manufacturing a light-receiving element according to any one of (12) to (17), in which the step of forming the photoelectric conversion layer and the semiconductor layer includes forming an insulating film that covers an inner face of the opening of the semiconductor layer.

(19)

An imaging device provided with a plurality of pixels, the imaging device including:

a substrate;

a photoelectric conversion layer that is provided on the substrate and includes a first compound semiconductor, and absorbs a wavelength in an infrared region to generate electric charges;

a semiconductor layer that is provided on the photoelectric conversion layer and includes a second compound semiconductor, and has an opening for each of the pixels; and a plurality of electrodes provided to bury the respective openings of the semiconductor layer and each electrically coupled to the photoelectric conversion layer.

(20)

An electronic apparatus with an imaging device, the imaging device being provided with a plurality of pixels, the imaging device including:

a substrate;

a photoelectric conversion layer that is provided on the substrate and includes a first compound semiconductor, and absorbs a wavelength in an infrared region to generate electric charges;

a semiconductor layer that is provided on the photoelectric conversion layer and includes a second compound semiconductor, and has an opening for each of the pixels; and a plurality of electrodes provided to bury the respective openings of the semiconductor layer and each electrically coupled to the photoelectric conversion layer.

The present application is based on and claims priority from Japanese Patent Application No. 2015-242235 filed with the Japan Patent Office on Dec. 11, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-receiving element, comprising:
a substrate;
a photoelectric conversion layer on the substrate, wherein
the photoelectric conversion layer includes a first compound semiconductor and a first conductivity-type layer,
the first conductivity-type layer is in a selective region of the photoelectric conversion layer,
the selective region of the photoelectric conversion layer is on a side of the photoelectric conversion layer, and
the photoelectric conversion layer absorbs a wavelength in an infrared region to generate electric charges;
a semiconductor layer on the photoelectric conversion layer, wherein
the semiconductor layer includes a second compound semiconductor, a first conductivity-type region, and a second conductivity-type region,
the semiconductor layer has an opening in a selective region of the semiconductor layer,
the first conductivity-type region faces the first conductivity-type layer,
the second conductivity-type region is around the first conductivity-type region,
the opening is in the first conductivity-type region,
the semiconductor layer is on the side of the photoelectric conversion layer;
a plurality of pixels, wherein
the first conductivity-type layer and the first conductivity-type region are for each of the plurality of pixels, and
adjacent pixels of the plurality of pixels are electrically separated by a boundary between the first conductivity-type region and the second conductivity-type region; and
a first electrode that buries the opening of the semiconductor layer, wherein the first electrode is electrically coupled to the photoelectric conversion layer.

2. The light-receiving element according to claim 1, wherein a side face of the opening of the semiconductor layer includes an inclined face.

3. The light-receiving element according to claim 1, wherein a type of impurity in the first conductivity-type layer is same as a type of impurity in the first conductivity-type region.

4. The light-receiving element according to claim 1, further comprising a protective layer that includes an insulating material on the semiconductor layer, wherein a bandgap of the second compound semiconductor is larger than a bandgap of the first compound semiconductor.

5. The light-receiving element according to claim 4, wherein the boundary between the first conductivity-type region and the second conductivity-type region is in contact with the protective layer.

6. The light-receiving element according to claim 1, further comprises an insulating film that covers an inner face of the opening of the semiconductor layer.

7. The light-receiving element according to claim 1, wherein the first compound semiconductor includes $In_xGa_{(1-x)}As(x:0<x\leq1)$.

8. The light-receiving element according to claim 7, wherein the second compound semiconductor includes one of InP or InAlAs.

9. The light-receiving element according to claim 1, further comprising a second electrode electrically coupled to the substrate.

10. A method of manufacturing a light-receiving element, the method comprising:
forming, on a substrate,
a photoelectric conversion layer that includes a first compound semiconductor and a first conductivity-type layer, wherein
the photoelectric conversion layer absorbs a wavelength in an infrared region to generate electric charges,
the first conductivity-type layer is in a selective region of the photoelectric conversion layer,
the selective region of the photoelectric conversion layer is on a side of the photoelectric conversion layer; and
a semiconductor layer that includes a second compound semiconductor, a first conductivity-type region, and a second conductivity-type region, wherein
the first conductivity-type region faces the first conductivity-type layer,
the semiconductor layer has an opening in a selective region of the semiconductor layer,
the second conductivity-type region is around the first conductivity-type region,
the opening is in the first conductivity-type region, and
the semiconductor layer is on the side of the photoelectric conversion layer;
forming, on the substrate, a plurality of pixels, wherein
the first conductivity-type layer and the first conductivity-type region are for each of the plurality of pixels, and
adjacent pixels of the plurality of pixels are electrically separated by a boundary between the first conductivity-type region and the second conductivity-type region; and
forming, on the substrate, an electrode that buries the opening of the semiconductor layer, wherein the electrode is electrically coupled to the photoelectric conversion layer.

11. The method of manufacturing the light-receiving element according to claim 10, wherein a side face of the opening of the semiconductor layer includes an inclined face.

12. The method of manufacturing the light-receiving element according to claim 11, wherein
a protective layer is on the semiconductor layer,
the protective layer includes an insulating material, and
a bandgap of the second compound semiconductor is larger than a bandgap of the first compound semiconductor.

13. The method of manufacturing the light-receiving element according to claim 12, wherein the boundary between the first conductivity-type region and the second conductivity-type region is in contact with the protective layer.

14. The method of manufacturing the light-receiving element according to claim 13, wherein the method further comprising:
forming the first compound semiconductor and the second compound semiconductor in order on the substrate, followed by forming the protective layer thereon, and
forming, with the protective layer as a mask, the first conductivity-type layer and the first conductivity-type region by diffusing an impurity in selective regions of the first compound semiconductor and the second compound semiconductor.

15. The method of manufacturing the light-receiving element according to claim 14, comprising:
forming the opening by etching the semiconductor layer with the protective layer as the mask.

16. The method of manufacturing the light-receiving element according to claim 10, wherein the method further comprising forming an insulating film that covers an inner face of the opening of the semiconductor layer.

* * * * *